United States Patent [19]
Martin et al.

[11] 3,969,752
[45] July 13, 1976

[54] HYBRID TRANSISTOR

[75] Inventors: John R. Martin; Vahan Garboushian, both of Torrance, Calif.

[73] Assignee: Power Hybrids, Inc., Torrance, Calif.

[22] Filed: Mar. 3, 1975

[21] Appl. No.: 554,624

Related U.S. Application Data

[63] Continuation of Ser. No. 420,763, Dec. 3, 1973, abandoned.

[52] U.S. Cl. .................................. 357/51; 357/68; 357/80
[51] Int. Cl.² ................... H01L 27/02; H01L 23/48; H01L 39/02
[58] Field of Search ............................ 357/51, 68, 80

[56] References Cited
UNITED STATES PATENTS

| | | | |
|---|---|---|---|
| 3,713,006 | 1/1973 | Litty et al. | 357/51 |
| 3,728,589 | 4/1973 | Caulton | 357/51 |

Primary Examiner—Andrew J. James
Assistant Examiner—E. Wojciechowicz
Attorney, Agent, or Firm—Ellsworth R. Roston

[57] ABSTRACT

A transistor having input, reference and output terminals includes a ceramic base with a metallized area plated thereon and a transistor die supported on the metallized area. The metallized area and the transistor die provide in an equivalent output circuit of the transistor a shunt capacitance which in combination with other characteristics in the equivalent output circuit adversely affects the output impedance, internal losses, and bandwidth of the transistor. A reactance branch including an inductor is connected between the metallized area and the reference terminal to provide in the equivalent output circuit an inductance which resonates with the shunt capacitance. By thus reducing the influence of the shunt capacitance in the equivalent output circuit, the reactance branch increases the output impedance, decreases the internal losses, and increases the bandwidth of the transistor.

20 Claims, 13 Drawing Figures

HYBRID TRANSISTOR

This is a continuation of application Ser. No. 420,763 filed Dec. 3, 1973, now abandoned.

BACKGROUND OF THE INVENTION

1. Field of the Invention

The present invention relates generally to semiconductor devices and more specifically to such devices which are adapted to provide signal outputs at high power levels and high frequencies.

2. Description of the Prior Art

Significant advances in modern technology have increased the demand for semiconductor devices which are capable of providing output signals at high power levels, such as 50 watts, and at high frequencies, such as 3 Gigahertz (GHz). This demand has also made it desirable to provide the semiconductor devices with a lower Q which corresponds to a wider bandwidth. The wider bandwidth enables the device to accommodate additional data channels which significantly increases the data throughput of the device.

Furthermore, it is always desirable to decrease in the internal losses of the semiconductor device since any power dissipated in the transistor package itself reduces the total power provided at the output of the device.

The semiconductor devices of the prior art have typically had low output impedances. These devices have commonly been used with transmission line systems and antenna systems which have a nominal impedance of 50 ohms. In order to match a semiconductor device to these systems and minimize the losses associated with the matching, elaborate impedance matching networks have been interposed between the semiconductor device and the associated system. These impedance matching networks increase the output impedance of the semiconductor device to provide an appropriate match with the impedance of the associated system. Typically, the output impedance for a high power semiconductor device is between 1 and 5 ohms. In order to match this impedance to a nominal 50 ohm level, the impedance matching networks have typically increased the output impedance of the device by a factor of 10 to 50.

The use of external impedance matching networks, especially tunable networks, significantly increases the cost of a high frequency amplifier. Also, due to additional components, the overall reliability of the combination is reduced while the size is increased. Impedance matching networks typically used in the above described manner include Chebyshev transformers, quarter wave transformers, L-networks and RLC networks.

Of course it is desirable to provide a semiconductor device with a high output impedance not only to reduce the complexity of the associated impedance matching networks but also to reduce the output current. Lower output currents result in lower power losses within the semiconductor device.

The bandwidth limitation, the internal losses, and the impedance matching characteristics of the semiconductor devices are all related to certain parasitic reactances within the transistor package and also to the lead bonds and parasitics associated with the transistor die. Of particular interest in the present invention are those parasitic reactances which inherently occur in the output of the transistor die and package. These reactances include a shunt capacitance, a virtual resistance, and a series inductance.

The shunt capacitance is associated with the transistor die which has a certain amount of inherent capacitance. This inherent capacitance increases directly with the power and the size of the transistor die.

The virtual resistance is actually located externally of the transistor but is commonly considered inside the transistor package for the purpose of determining optimum collector load impedance. The value of this virtual resistance is related to the collector voltage, the saturation voltage and the power output of the transistor.

The series inductance is an unavoidable package parasitic inductance. This inductance results primarily from the physical length of the collector lead bonds. Of course the collector lead bonds will always have some length so that there will always be some series inductance.

In combination these parasitic quantities result in an equivalent circuit including a relatively low value of series resistance and relatively high value of series reactance. The relatively low value of the series resistance reduces the magnitude of the output impedance so that significant transformations are required by an external matching network.

Of course the lower output impedances of the devices of the prior art provide relatively high output currents. As a consequence, the resistance losses in the transistor package have been relatively high. For example, a typical loss in the parasitic series inductance might be as high as 9% of the total power developed by the transistor.

The theoretical bandwidth of these semiconductor devices is equal to the value of the series resistance divided by the value of the series reactance. Since the value of the series resistance in the devices of the prior art has been relatively low, the theoretical bandwidth of these devices has been relatively narrow.

SUMMARY OF THE INVENTION

In accordance with the present invention, a transistor package is provided with a relatively high output impedance which decreases the complexity of the associated impedance matching networks and also reduces the magnitude of the output current. By reducing the current, the internal losses in the transistor package are significantly reduced. For example a loss in the parasitic series inductance will typically be less than 2% of the total power as compared to approximately 9% in the devices of the prior art.

Of particular advantage to the present invention is a substantial incraase in the bandwidth of the transistor package. In some embodiments, the bandwidth of the device is actually doubled. This not only doubles the number of data channels that can be accommodated by a single device but also provides a significant increase in the data throughput of the system.

In accordance with several embodiments of the present invention, an internal inductance is connected in parallel with the shunt capacitance of the transistor die and provided with a value such that the inductive reactance of the shunt inductance is equal to the capacitive reactance of the shunt capacitance. Under these conditions, the shunt capacitance and the shunt inductance resonate so that their respective reactance characteristics are substantially cancelled in the equivalent circuit.

This provides the equivalent circuit with a significantly higher series resistance and a series reactance which is substantially equal to the reactance provided by the parasitic series inductance. These quantities provide an output impedance which is greater than the devices of the prior art. This greater impedance reduces the series current in the output circuit so that the power losses internally of the transistor package are significantly reduced. The higher series resistance in the equivalent circuit is primarily responsible for the significant increase in the theoretical bandwidth of the present device.

The internal shunt inductance can be provided in the transistor package in accordance with various embodiments of the invention. A reactance branch including a capacitance in series with an inductance is typically connected in parallel with a shunt die capacitance. The capacitance can be provided by an MOS capacitor or a discrete capacitor. The inductance can be provided by a lumped tuning wire or a high impedance transmission line connected from the capacitance to the transistor die of the device. In another embodiment, the capacitor is formed on the same substrate with the transistor die and the inductance connects the capacitance to a ground terminal. This embodiment reduces the capacitive reactance since the capacitor is displaced from the ground node.

While the specification concludes with claims particularly pointing out and distinctly claiming the subject matter which is regarded as the invention, it is believed that the invention, and the objects, features and advantages thereof will be better understood from the following description taken in connection with the accompanying drawings.

DESCRIPTION OF PREFERRED EMBODIMENTS

Figure 1:
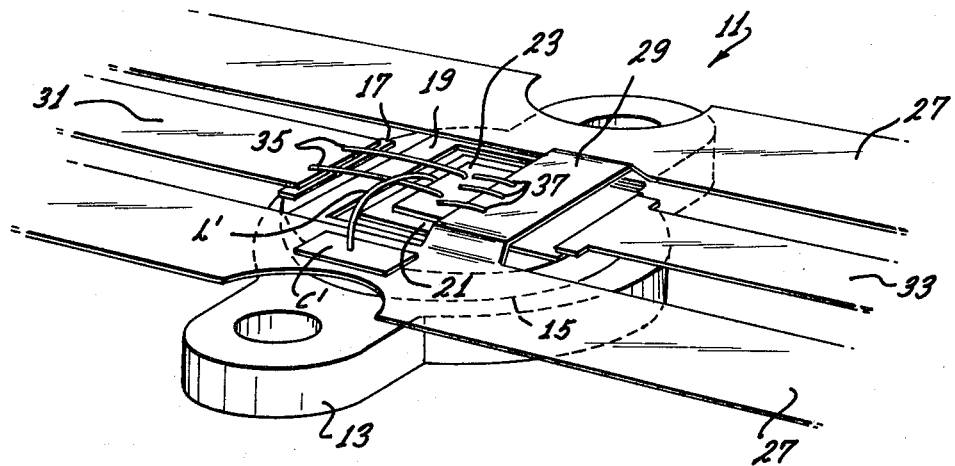
FIG. 1 is a perspective view partly in phantom and illustrating one of the embodiments of the present invention.
Figure 2:
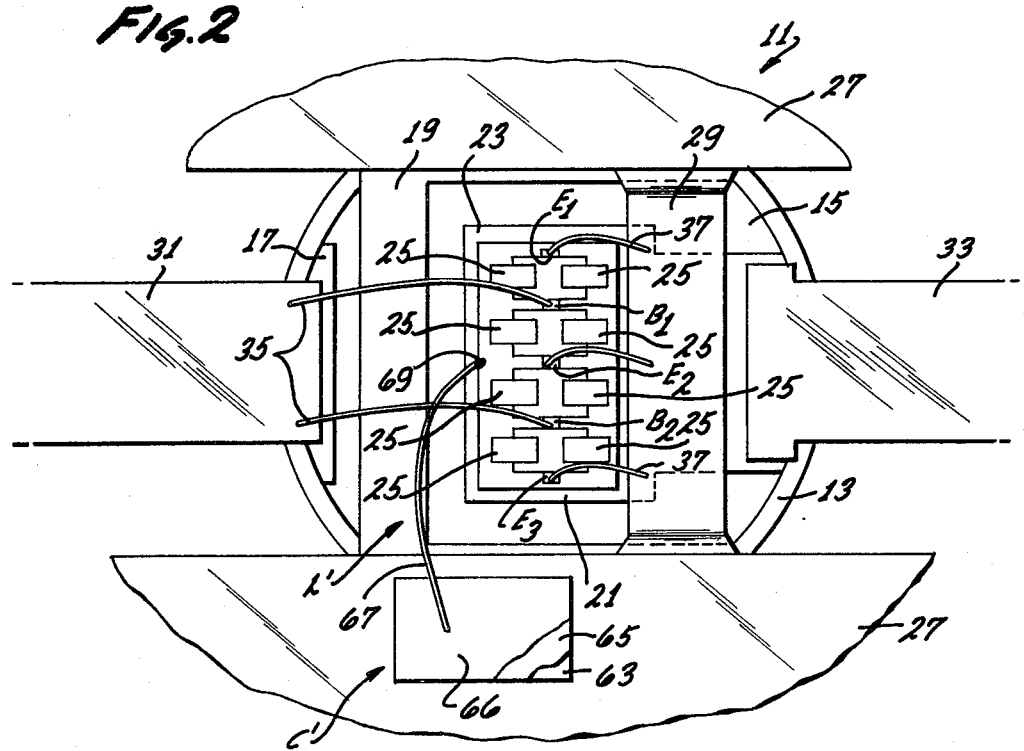
FIG. 2 is a plan view of the transistor package illustrated in FIG. 1.

A transistor or transistor package 11 is illustrated in perspective in FIG. 1 and in greater detail in the plan view of FIG. 2. The transistor package 11 includes a main body member 13 which provides the primary structural support for the transistor 11. A ceramic member 15 is disposed on top of the main body member 13 and three discrete metallized areas 17, 19 and 21 are plated on the ceramic member 15 in accordance with well known metallization techniques.

The metallized area 21 provides a base for a transistor die 23 which is shown generally in FIG. 1 and in greater detail in FIG. 2. The transistor die 23 will typically include a plurality of transistor cells which are designated in FIG. 2 by the reference numeral 25. The number of cells 25 will vary with particular embodiments of the invention between, for example, 1 and 40 cells. In the embodiment illustrated, eight transistor cells 25 are arranged with their bases and emitters joined to define the emitter terminals $E_1$, $E_2$, and $E_3$, and the base terminals $B_1$ and $B_2$.

The metallized area 19 is of sufficient length to extend substantially across the ceramic member 15 to provide electrical continuity between a pair of ground terminals 27. A bridge member 29, which is illustrated to pass over the metallized area 21, also provides continuity between the ground terminals 27. An input terminal 31 is electrically connected to the metallized area 17 and an output terminal 33 is electrically connected to the metallized area 21.

In a common emitter configuration, a base lead 35 will typically be bonded between each of the base terminals $B_1$, $B_2$ on the transistor die 23 and the input terminal 31. Similarly, an emitter lead 37 will be connected between each of the emitter terminals $E_1$, $E_2$, $E_3$ on the transistor die 23 and the bridge 29. In a particular embodiment, additional emitter leads (not shown) may be connected between the emitter terminals $E_1$, $E_2$, $E_3$ and the metallized area 19 to reduce the total inductance of the emitter leads. In this common emitter configuration, the output terminal 33 is the collector of the transistor 11.

Although a common emitter configuration is illustrated in FIGS. 1 and 2, it should be understood that the present invention is not limited to this configuration and will operate equally well in a common base configuration. In a common base configuration, the base terminals $B_1$, $B_2$ are connected to the bridge 29 and the metallized area 19 and the emitter terminals $E_1$, $E_2$ and $E_3$ are connected to the input terminal 31. In either configuration, the output terminal 33 would provide the collector terminal of the transistor 11.

To the extent described above, the transistor package 11 is well known and widely used within the state of the art.

Figure 3:
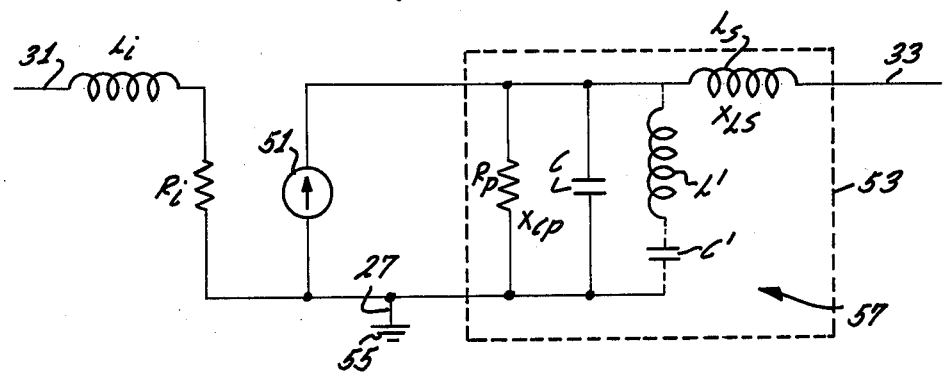
FIG. 3 is an equivalent circuit of the transistor package illustrated in FIG. 1 showing the output parasitics and a shunt reactance branch associated with the invention.

An equivalent circuit of the transistor 11 illustrated in FIGS. 1 and 2 is shown schematically in FIG. 3. It is well known that such an equivalent circuit includes an input imductance $L_i$ which represents generally the inductance of the base lead bonds 21. Also included in the equivalent circuit is a resistance $R_i$ which reprsents the input impedance of the transistor 11. This inductance $L_i$ and resistance $R_i$ represent the equivalent circuit for the input of the transistor package 11.

Of particular interest to the present invention is the equivalent circuit for the output of the transistor package 11. This equivalent circuit includes a current generator 51 and a plurality of output parasitics which are shown generally within the dotted line and designated by the reference numeral 53.

These output parasitics 53 typically include a virtual resistance $R_p$ where the sub $_p$ implies a parallel relationship with the generator 51. The virtual resistance $R_p$ represents the output resistance of the transistor package 11 and is commonly derived from the following formula:

$$R_p = \frac{(V_{cc} - V_{sat})^2}{2 P_o} \quad \text{(Eq. 1)}$$

where:

$V_{cc}$ is the operating voltage applied to the collector terminal 15;

$V_{sat}$ is the saturation voltage of the transistor 11; and $P_o$ is the power output of the transistor 11 which is developed across the virtual resistance $R_p$.

The output parasitics 53 also include a shunt capacitance $C_{Cp}$ which has a reactance $X_{Cp}$. This shunt capacitance $C_{Cp}$ results primarily from the capacity of the transistor die 19 which increases directly with the power output and the size of the transistor package 11.

Figure 3A:
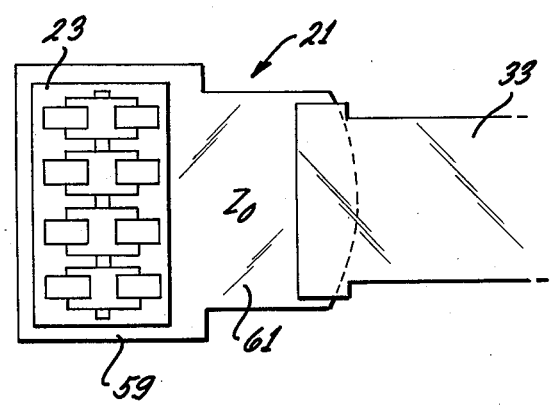
FIG. 3a is a plan view of the metallized area associated with the output conductor of the transistor package illustrated in FIG. 1.

The output parasitics 53 also include a series inductance $L_s$, which has an inductive reactance $X_{Ls}$ which results primarily from an inductance that is inherent in the metallized area 21. A plan view of the metallized area 21, the transistor die 23, and the output terminal 33 is shown in FIG. 3a. It will be noted that the metallized area 21 typically includes a transistor island 59 on which the transistor die 23 is mounted. Extending from the island 59 is a strip 61 of metal, sometimes referred to as a collector lead, which connects the transistor island 59 with the output terminal 33.

To provide optimum results it is desirable that the impedance of the transistor die 23, the impedance of the strip 61, and the impedance of the load connected to the output terminal 33, be equal. Under these desirable conditions, there will be no inherent reactance in these elements. The impedance of the transistor die 23 will typically be approximately 2 ohms.

At an operating frequency, such as 1.5 GHz, the metal strip 61 functions as a microwave strip line. The strip 61 will typically be between 30 and 40 mils in width, and between 50 and 60 mils in length. The impedance $Z_o$ of such a strip 61 will typically be in a range between 40 and 80 ohms. The difference between the impedance of the transistor island 59, such as 2 ohms, and the impedance of the strip 61, such as 40 to 80 ohms, will provide the strip 61 with an apparent inductance. It is this inductance of the strip 61 which is primarily represented in FIG. 3 by the series inductance L.

The inductance of a microwave strip can be computed in accordance with the following formula:

$$L = \frac{Z_o \sin 2\pi f l/v}{2\pi f} \quad \text{(Eq. 2)}$$

where:

$Z_o$ is the impedance of the strip and is related to the width and the thickness of the strip;

$l$ is the length of the strip;

$v$ is the velocity of a microwave in the particular dielectric media; and $f$ is the frequency of operation.

As previously mentioned, the output parasitics 53 have a significant effect upon the bandwidth, the internal losses, and the output impedance of the transistor package 11. These effects can best be illustrated by assuming typical operating characteristics for the transistor package 11. By way of example only, it will be assumed that the transistor package 11 will have a power output $P_o$ of 30 watts at an operating frequency $f$ of 1.5 GHz. It will be further assumed that the strip 61 has dimensions providing the series inductance L with a value of 2 nanohenries and that the shunt capacitance C has a typical value of 20 picofarads.

The virtual resistance $R_p$ can be derived from Equation 1 with a further assumption that the collector voltage $V_{cc}$ is 28 volts and the saturation voltage $V_{sat}$ of the transistor is 3 volts. Substituting this typical value into Equation 1, it can be shown that the virtual resistance $R_p$ for this particular example is equal to 10.4 ohms.

The reactance of the shunt capacitance $C_{Cp}$ can be derived from the following well-known formula:

$$X_{Cp} = 1/2\pi f c \quad \text{(Eq. 3)}$$

Substituting the typical values for the operating frequency $f$ and the shunt capacitance $C_{Cp}$ into Equation 3 it can be shown that the capacitive reactance $X_{Cp}$ for this example is equal to 2.65 ohms.

The series inductive reactance can also be derived from the following well-known forula:

$$X_{Ls} = 2\pi f L \quad \text{(Eq. 4)}$$

For a series inductance of 2 nanohenries and an operating frequency $f$ of 1.5 GHz, it can be shown that the series inductive reactance $X_{Ls}$ is equal to 18 ohms.

Figure 4:
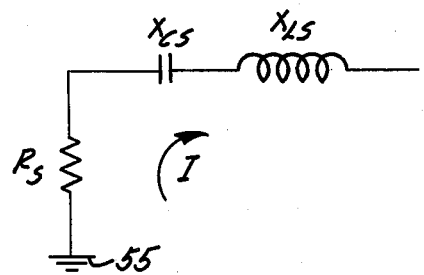
FIG. 4 is a series equivalent circuit of the output parasitics illustrated in FIG. 3.

The equivalent circuit including the virtual resistance $R_p$ and the capacitive reactance $X_{Cp}$ can be converted to an equivalent series circuit, as shown in FIG. 4, including a series resistance $R_s$ and a series capacitive reactance $X_{Cs}$. The values of these equivalent series elements can be derived from the following formulas:

$$R_s = \frac{R_p X_{Cp}^2}{R_p^2 + X_{Cp}^2} \quad \text{(Eq. 5)}$$

$$X_{Cs} = \frac{R_p^2 X_{Cp}}{R_p^2 + X_{Cp}^2} \quad \text{(Eq. 6)}$$

With proper substitution in Equations 5 and 6, it can be shown that a typical value for $R_s$ is 2.14 ohms and a typical value for $X_{Cs}$ is 3.4 ohms.

Figure 5:
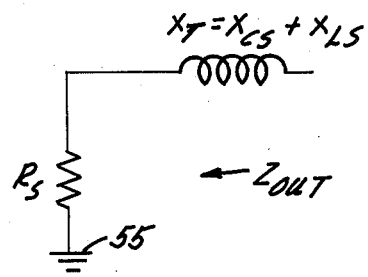
FIG. 5 is an equivalent circuit of the circuit illustrated in FIG. 4.

A total series equivalent circuit for the output parasitics 53 illustrated in FIG. 3 can be derived by adding the series inductive reactance $X_{Ls}$ to the series capacitive reactance $X_{Cs}$ to provide a total series reactance $X_T$. Such a circuit is illustrated in FIG. 5. Since the series capacitive reactance is negative and less than the series inductive reactance $X_{Ls}$, the total series reactance $X_T$ is illustrated to have inductive characteristics. For the typical values assumed, the total series reactance will be equal to approximately 14.6 ohms.

Given the values for the series resistance $R_s$ and the total series reactance $X_T$, the output impedance $Z_{out}$ for this particular transistor can be expressed as follows:

$$Z_{out} = R_s + jX_T \quad \text{(Eq. 7)}$$

The bandwidth of this typical transistor can be derived by dividing the real component of the output impedance by the reactive component of the output impedance. Using the previous notation, it can be shown that the theoretical bandwidth equals:

$$\text{Bandwidth} = R_s/X_T \quad \text{(Eq. 8)}$$

Again assuming the typical value specified above, it can be shown that the bandwidth of this typical transistor of the prior art is $1.0 \times 10^8$ Hertz.

If the capacitive series reactance $X_{Cs}$ and the inductive series reactance $X_{Ls}$ were pure reactances the power developed across the series resistance $R_s$, such as 30 watts, would appear on the collector terminal 15 of the transistor package 11. It is well known, however, that every inductance includes some inherent resistance so that the current circulating through the emitter-collector junction will produce some power loss in the parasitic series inductor L.

A typical value for the inherent resistance of the parasitic series inductance L is 0.18 ohms. If the power developed across the series resistance $R_s$ is 30 watts, it follows that the circulating current I is equal to 3.78 amps for a sine wave. The loss in the series inductance L would then be equal to the current I squared times the inherent resistance of the series inductance L. For a typical value of inherent resistance, such as 0.18 ohms, the loss in the series inductance L would be equal to 2.57 watts. It will be noted that this power loss is almost 9% of the total power (30 watts) developed by the transistor 11.

These values for the bandwidth, the internal loss, and the output impedance of the transistor 11 have been computed for comparison with similar values which will be derived below for the transistor package 11 of the present invention. The values derived above are representative of the transistor packages of the prior art. Of course it is always desirable to increase the bandwidth, raise the output impedance, and decrease the internal losses in a particular transistor package.

In the past, attempts have been made to obtain these desirable results by adding various elements externally of the transistor package i.e. by connecting the elements to the output terminal 33. For example, a capacitor (not shown) has been connected externally of the transistor package 11 and in series with the series inductance L. The additional capacitor has been provided with a value such that it resonates with the series inductance L. Although the addition of such an external series capacitance has increased somewhat the bandwidth of the combination, it has not reduced the output impedance of the transistor package. As a consequence, the circulating current has remained high so that the losses associated with the additional capacitor have further reduced the power of the combination.

The series inductance L has been desirable for the most common type of output matching involving the low pass Chebyshev transformers. With this type of transformation, the series inductance can be used in the first state of transformation. A series capacitor which reduces the influence of this series inductance is therefor undesirable for use with this most common type of output matching.

In some systems, a shunt inductor (not shown) has been connected externally to the transistor package 11 to the output terminal 33. This has only been desirable if the equivalent series output circuit such as that shown in FIG. 5, has capacitive rather than inductive characteristics. Under these unusual circumstances, the shunt inductor can be resonated with the capacitive characteristics of the total series reactance $X_T$. In the rare case wherein the transistor package is not past resonance, this external shunt inductance has had the effect of increasing the bandwidth. As was the case with the series capacitance, however, the circulating currents are not reduced so that the shunt inductance provides further losses for the combination.

In accordance with the present invention a reactance branch, shown generally at 57 in FIG. 3, is connected internally rather than externally of the transistor package 11 and in parallel with the shunt capacitance $C_{CP}$. The reactance branch 57 will typically include a particular inductance L' connected in series with a particular bypass capacitance C'.

Figure 6:
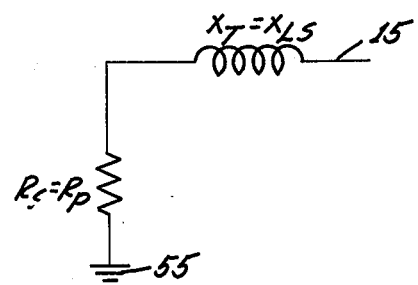
FIG. 6 is a series equivalent circuit of the output parasitics and the shunt reactance branch illustrated in the equivalent circuit of FIG. 3.

The particular capacitance C' is a DC blocking capacitance which is preferably sufficiently large that it does not introduce a significant capacitive reactance in the reactance branch 57. For example, in a particular embodiment wherein the particular inductance L' is approximately 1 nanohenry, the particular capacitance can have a value of 100 picofarads. At an operating frequency such as 1.5 GHz, this will provide a capacitive reactance which is generally below 10% of the inductive reactance in the branch 57. If the particular inductance L' is provided with a value such that its reactance is equal to the capacitive reactance $X_{Cp}$ at the operating frequency, the shunt capacitance C and the particular inductance L' will resonate thereby cancelling the effect of the shunt capacitance C in the equivalent circuit. In the absence of the shunt capacitance $C_{Cp}$, the equivalent series circuit would include a series resistance $R_s$ equal to $R_p$ and a total reactance $X_T$ equal to the series inductive reactance $X_{Ls}$ as shown in FIG. 6.

The effect which the addition of the particular inductance L' has upon the bandwidth, the output impedance, and the internal losses of the transistor 11 is particularly surprising. First of all it will be noted that for the typical values specified, the output impedance computed in accordance with the Equation 7 is equal to $Z_{out} = 10.4 + j18.8$ compared to $Z_{out} = 2.1 + j14.6$ for the typical transistor packages of the prior art. The real value of the output impedance which is of primary importance in the output matching is therefore increased from 2.1 ohms to 10.4 ohms. Practically speaking, this increase in the output impedance means that fewer transformations will be needed in an external transforming network to raise the impedance of the transistor 11 to the nominal level of 50 ohms. This will increase the reliability of the apparatus and decrease the total circuitry involved in the output transformations.

It will also be noted that in a power output $P_o$ of 30 watts is developed across a resistance $R_s$ of 10.4 ohms, the circulating current will be only 1.7 amps. A current of this magnitude will produce a power loss in the parasitic series inductance L of only 0.52 watts if the inherent resistance is 0.18 ohms as previously assumed. Thus, for the same series inductance L, the addition of the reactance branch 57 reduces the power loss in the series inductance $L_s$ from a value of 2.57 watts to only 0.52 watts. Stated differently, the loss in the series inductance is reduced from approximately 9% to less than 2% of the total power output The theoretical bandwidth of the transistor package 11 including the particular inductance 57 can be computed in accordance with Equation 8. If the real component of the output impedance is 10.4 ohms, and the reactive component of the output impedance is 18.8 ohms, the transistor package 11 will have a theoretical bandwidth of $8 \times 10^8$ Hertz. This provides a significant increase over the theoretical bandwidth of the prior art devices which, as previously computed, is typically $1 \times 10^8$ Hertz.

The characteristics of the reactance branch 57 can be provided in the transistor package 11 in accordance with various embodiments of the invention. Referring for example to FIGS. 1 and 2, it will be noted that the particular capacitance C' in the reactance branch 57 can be formed directly on the ground terminal 27 using well known MOS techniques. For example, in a particular embodiment, the capacitance C' is provided by soldering a layer 63 of substrate material such as doped low resistivity silicon to the ground terminal 27. A layer 65 of monocrystalline material, such as silicon dioxide, or an amorphous oxide can be deposited on the upper surface of the substrate layer 63. Finally, a layer 66 of conductive material, such as gold, can be deposited on the upper surface of the layer 65. The layers 63, 65 and 66 may be rectangular in configuration with dimensions such as 30 mils by 60 mils. The substrate layer 63 can be approximately 3 to 5 mils in thickness and the layer 65 can be approximately 0.3 microns in thickness. These dimensions will provide the capacitance C' with a value of approximately 100 picofarads.

The inductance L' in the reactance branch 57 can be provided by a lumped tuning wire 67 connected between the metal layer 66 of the capacitance C' and the metallized area 21. This wire 67 will typically have a length at least five times as great as its diameter so that the following formula provides an excellent approximation of the particular inductance L':

$$L = .005081 \left[ 2.303 \log \left( \frac{4l}{d} - 1 \right) \right] \quad \text{(Eq. 9)}$$

where:

L is the inductance of the wire 67 in microhenries;
l is the length of the wire 67 in inches; and
B is the diameter of the wire 67 in inches.

From Equation 9 it can be shown that if the lumped tuning wire 67 is provided with a length of 0.060 inches and a diameter of 0.002 inches it will provide an inductance of approximately 1 nanohenrie which at the operating frequencies of interest will provide an inductive reactance of approximately 9.4 ohms in the reactance branch 57.

The wire 67 is attached to the metallized area 21 at a point of connection 69 which is preferably positioned equidistant from each of the cells 25. The current which passes from the cells 25 through the reactance branch 57 will travel along thin conductive paths in the metallized area 21. At an operating frequency such as 1.5 GHz, these conductive paths will function as microwave strip lines. If these lines differ in length, they will not only have different resistance characteristics but also different reactance characteristics as illustrated by Equation 8. For this reason it is desirable that the point of connection 69 be equidistant from each of the cells 25.

Ideally the point of connection 69 would be located on the metallized area 21 beneath the center of the transistor die 23. However, since the transistor die 23 will typically be mounted directly to the metallized area 21, it may be impractical to locate the point of connection 69 between the die 23 and the area 21. For this reason, the point of connection 69 in a preferred embodiment is located centrally along one of the long sides of the transistor die 23, as illustrated in FIGS. 1 and 2.

Figure 7:
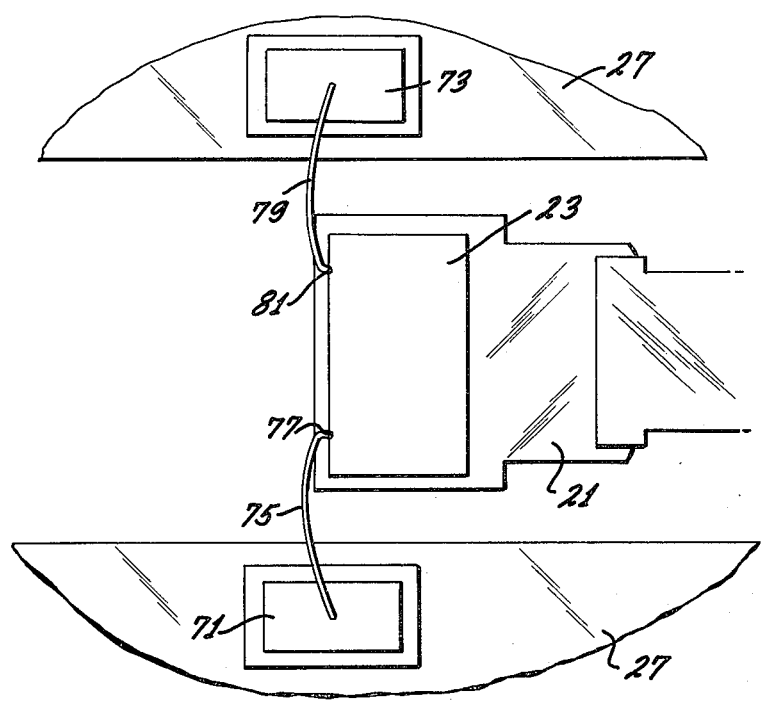
FIG. 7 is a plan view of a portion of the transistor package illustrating an additional embodiment of the present invention.

FIG. 7 illustrates the ground terminals 27 and the transistor die 23 positioned on the metallized area 21. In this embodiment of the invention, the capacitance C' is provided by a pair of MOS capacitors 71 and 73 each of which is formed on a respective one of the ground terminals 27 in the manner described with reference to the embodiment of FIG. 2.

In this embodiment, the particular inductance L' is provided by a pair of lumped tuning wires 75 and 77. The respective inductances of the wires 75, 77 can be computed in accordance with Equation 9. In the absence of mutual inductance, the particular inductance L' can then be determined by dividing the sum of the respective inductances by the product of the respective inductances. If the respective inductances of the wires 75 and 77 are equal the particular capacitance C' can be determined by adding the values of the capacitors 71 and 73.

In this particular embodiment, the wire 75 extends from the capacitor 71 to a point of connection 77 on the metallized area 21. Similarly, the wire 79 extends from the capacitor 73 to a point of connection 81 on the metallized area 21. Preferably the points of connection 77 and 81 are symmetrically disposed with respect to the transistor die 23 for the reasons previously mentioned. For a transistor die having a rectangular configuration, this means that the points of connection 71 and 81 can be connected to the metallized area 21 along one of the long sides of the transistor die 23 and equidistant from the nearest short side of a transistor die 23.

The dual capacitor embodiment illustrated in FIG. 7 gives greater by-pass reactance than the single capacitor embodiment illustrated in FIG. 2. Also, smaller values can be used for the capacitors 71 and 73 to increase their respective breakdown voltages and to reduce their respective sizes. One advantage of the embodiment illustrated in FIG. 2 is that only a single capacitor need be mounted and bonded to the ground terminal 27. Also, the inductance of the single wire 67 is easier to control than the combined inductances of the wire 75 and 79.

Figure 8:
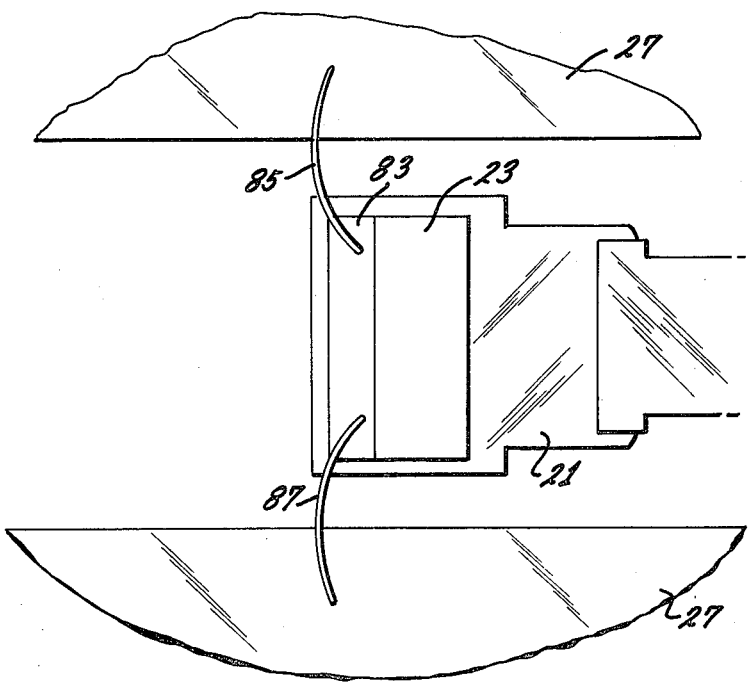
FIG. 8 is a plan view of a portion of the transistor package illustrating a further embodiment of the present invention.

Another embodiment of particular interest is that illustrated in FIG. 8. As with previous embodiments, the metallized area 21 is disposed between the ground terminals 27, and the transistor die 23 is bonded to the metallized area 21. In this embodiment however, the particular capacitance C' in the reactance brush 57 is provided by an MOS capacitor 83 which can be manufactured on the same substrate with the transistor die 23.

This embodiment provides the obvious advantage of saving steps in manufacturing the transistor die 23 and the capacitor C'. It should also be noted that in this embodiment, the capacitor 83 is mounted on the metallized area 21 simultaneously with the transistor die 23.

This saves at least one mounting step in the manufacture of the transistor package 11. Of course the capacitor 83 takes up some space on the metallized area 21 that could otherwise be devoted to additional cells in the transistor die 23.

In this embodiment the inductance L' is provided by at least one wire such as the pair of wires 85 and 87 which connect the capacitor 83 with the ground terminal 27.

Figure 8A:
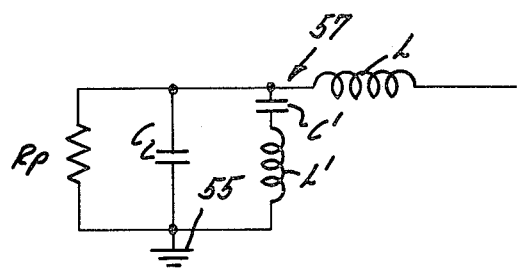
FIG. 8a is an equivalent output circuit of the transistor package including the portion thereof illustrated in FIG. 8.

The equivalent output circuit for the embodiment illustrated in FIG. 8 is shown schematically in FIG. 8a. It will be noted that in this particular reactance branch 57, the inductance L' is connected to ground 55 while the capacitance C' is connected to the parasitic series inductor L. As opposed to the configuration illustrated in FIG. 3, the embodiment of FIG. 8 is preferred since the capacitance C' is not connected to a current node. Under these circumstances, less loss will be realized in the particular capacitance C'.

Figure 9:
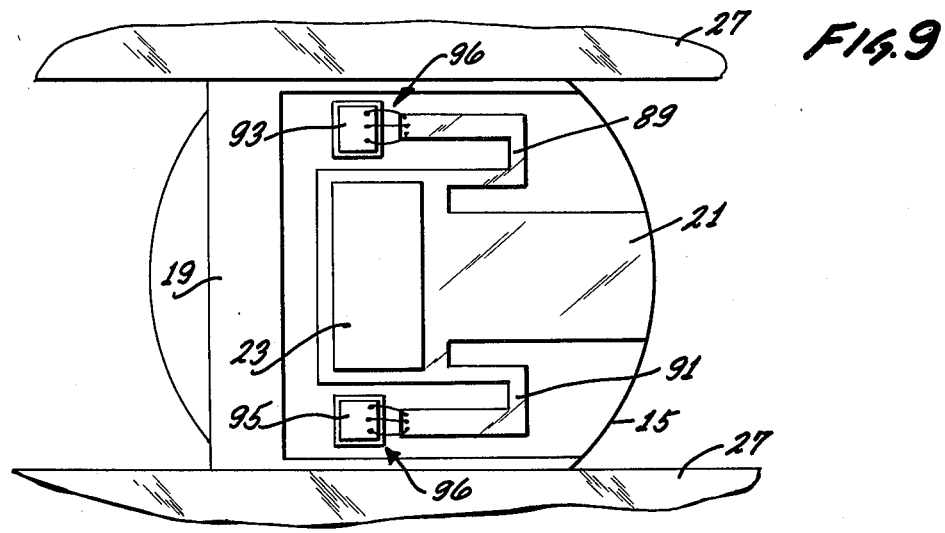
FIG. 9 is a plan view of a portion of the transistor package illustrating a further embodiment of the present invention.

A further embodiment of the invention is illustrated in FIG. 9 wherein it will be noted that the metallized area 21 is extended along relatively long and narrow strips 89 and 91. At an operating frequency such as 1.5 GHz, the strips 89 and 91 will function as microwave strip lines to provide the particular inductance L' in the reactance branch 57. The inductance of the respective strips 89 can be computed from Equation 2 as previously discussed. The sum of these respective inductances can then be divided by the product of the respective inductances to determine the value of L'.

The capacitance C' in this embodiment is provided by the capacitors 93 and 95 which are connected respectively to the strips 89 and 91 by at least one bond wire 96. These bond wires 96 are preferably sufficiently short that their inductances can be disregarded.

The use of microwave strip lines for the inductance L' is of particular advantage since, as previously noted, the inductance of such lines can be closely controlled. Furthermore, the strips 89, 91 can be printed with the other metallized areas 17, 19 and 21. Additionally, this technique can provide relatively large inductances which are particularly desirable for the low operating frequencies. Furthermore, the bonding of the wires 96 to the capacitors 93, 95 and the strips 89, 91 is not critical in this particular embodiment.

In the embodiments illustrated in FIGS. 7 and 9, the MOS capacitors 71, 73, 93 and 95 can be replaced with discrete dapacitors. Discrete capacitors typically have a higher power capacity at lower frequencies. Additionally, there is less loss in a discrete capacitor than in a MOS capacitor. Furthermore, the discrete capacitors typically provide large values of capacitance in smaller sizes.

If relatively high operating frequencies in a range between 3 and 5 GHz are used, it is desirable that the inductance L' in the reactance branch 57 have a very small value such as 0.15 nanohenries. In embodiments wherein this inductance is provided by a particular length of wire or microwave strip material, it may be difficult to accurately provide such a low value of inductance.

Figure 10:
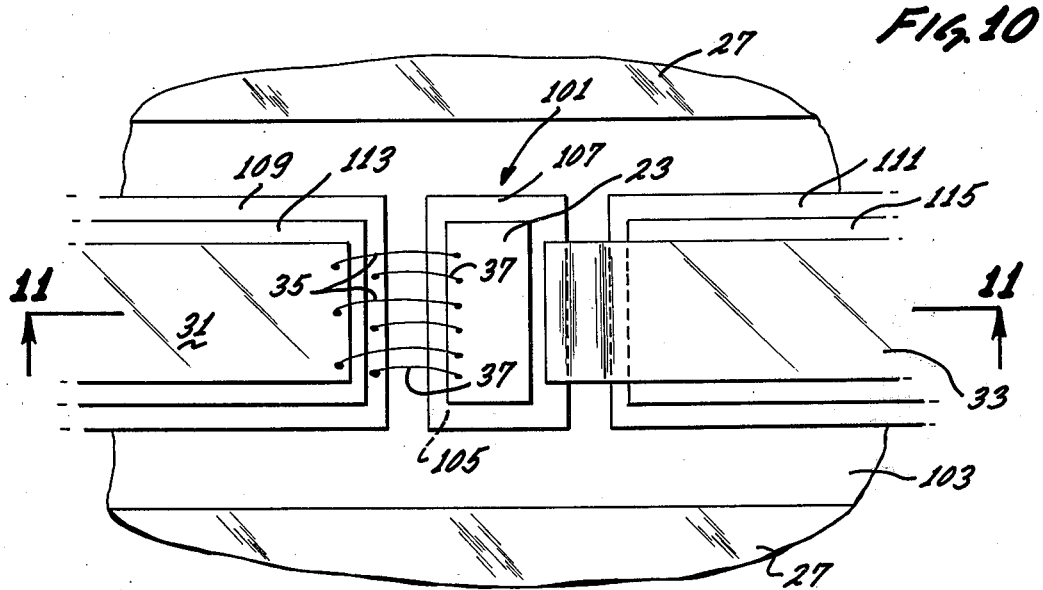
FIG. 10 is a plan view of the transistor package illustrating still a further embodiment of the present invention.
Figure 11:
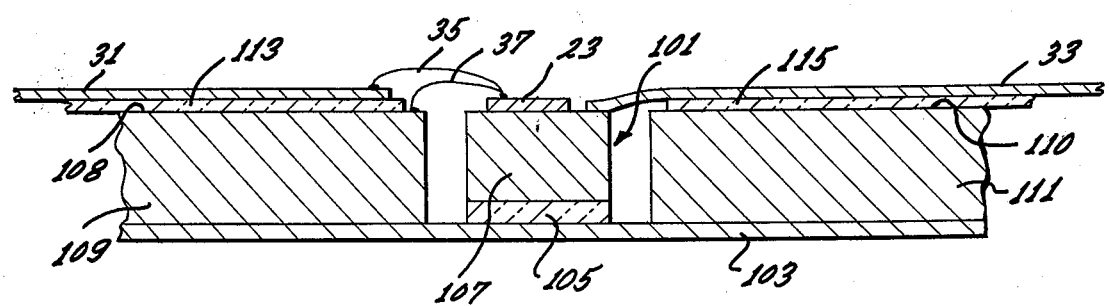
FIG. 11 is a cross-section view of the transistor package taken on line 11—11 of FIG. 10.

In a further embodiment of the invention illustrated in FIGS. 10 and 11, very low values of inductance can be provided by supporting the transistor die 23 on a pedestal 101. The pedestal 101 can be supported on a layer 103 of metal or other conductive material which is connected to the ground terminal 27 of the transistor package 11. The pedestal 101 includes an insulation layer 105 in contact with the layer 103 and a metallic layer 107 electrically insulated from the layer 103 by the layer 105. The transistor die 23 can then be supported on the metallic layer 107.

To facilitate the electrical connection of the input terminal 31 and the output terminal 33, a pair of supporting members 109 and 111 can provide surfaces 108 and 110 at approximately the height of the pedestal 101 to support the input terminal 31 and the output terminal 33 respectively. The supporting members 109 and 111 will typically be formed from metal in electrical contact with the layer 103. In this particular embodiment, it is desirable that the input terminal 31 be separated from the supporting member 109 by a layer of insulation 113. Similarly, the output terminal 33 can be insulated from the supporting member 111 by a layer of insulation 115.

In a common emitter configuration, the output terminal 33 can be electrically connected to the metallic layer 107 of the pedestal 101. The emitter bond wires 37 can be connected from the transistor die 23 to the supporting member 109, and the base bond wires 35 can be connected from the transistor die 23 to the input terminal 31. Connections for a common base configuration will be apparent to those of ordinary skill in the art.

In a particular embodiment, the pedestal 101 may have in horizontal cross-section a rectangular configuration and dimensions of approximately 30 mils by 60 mils. The height of the metallic layer 107 in the pedestal 101 may be approximately 60 mils. At a normal operating frequency in the range between 1.5 and 5 GHz, the metal layer 107 will function as a microwave strip to provide inductance L' in the reactance branch 57. In an embodiment wherein the metal layer 107 has the dimensions indicated above, the value of the inductance L' will be approximately 0.15 nanohenries.

In the embodiment illustrated in FIGS. 10 and 11, the particular capacitance C' in the branch 57 is provided by the capacitive characteristics which occur across the insulation 105 between the metal layer 107 and the ground layer 103.

Since the heat from the transistor die 23 will typically dissipate through the pedestal 101 into the ground layer 103, it is desirable that the insulation layer 105 not only have insulating characteristics but also characteristics providing for a high heat conductivity. In a preferred embodiment, the layer 105 is formed from beryllium oxide.

In this particular embodiment, the inductance L' has a value which is dependent upon the cross-sectional area and the vertical dimension of the pedestal 101. These dimensions are easily controlled in a plating process so that relatively small values of inductance can be provided. In this manner, the transistor package 11 of the present invention can provide its significant advantages even at operating frequencies as high as 5 GHz.

In accordance with any of the foregoing embodiments of the invention, a particular reactance branch 57 can be provided internally of the transistor package 11 to reduce the effect of the shunt capacitance C in the equivalence output circuit of the transistor 11. By inhibiting this effect, both the series resistance and the series reactance in the output circuit are increased. Of particular advantage is the fact that an increase in the series resistance provides a significant increase in the output impedance of the transistor package 11 so that the circuitry associated with output matching transformations can be significantly reduced.

The higher output impedance also reduces the circulating currents so that current losses in the transistor package 11 are reduced.

Of particular importance is the fact that the ratio of the series resistance to the series reactance in the output circuit is increased. This provides the output circuit with a lower Q which corresponds to an increased bandwidth for the transistor package 11. This bandwidth can actually be doubled so that the number of data channels which can be accommodated by the transistor package 11 can also be doubled. This is particularly desirable in data communications systems where the transistor package 11 can actually double the data throughput of the system.

Although the invention has been described with reference to particular embodiments, it will be apparent that the invention can be otherwise embodied so that the scope of the invention should be ascertained only with reference to the following claims.

We claim:

1. A transistor package for providing in an output circuit a low reactance and a high resistance within a range of operating frequencies to enhance the power output from the transistor package in the range of operating frequencies, including:
    a body member providing structural support for the transistor package;
    an insulating member disposed on the body member;
    at least a pair of thin metallic layers disposed on the body member in an electrically insulated relationship with the body member and in electrically insulated and spaced relationship with one another on the body member;
    a transistor die disposed on the insulating member and including at least one transistor cell disposed on the body member in electrically isolated relationship with the metallic layers and defining a plurality of different electrodes in the cell;
    first means providing electrical connections between individual ones of the metallic layers and individual ones of the electrodes in the cell to provide for input connections to the transistor cell;
    the transistor die and the metallic layers being constructed to provide in an equivalent output circuit of the transistor package characteristics including a shunt capacitance and a series inductance;
    second means formed on the insulating member to define a capacitive reactance; and
    third means supported on the insulating member to define an inductive reactance and connected electrically to the second means to provide a series circuit with the second means and a parallel relationship between the series circuit and the shunt capacitance and a series circuit between the parallel relationship and the series inductance,
    the second and third means being provided with values to define an inductive reactance in their series relationship and the inductive reactance to provide a resonance with the shunt capacitance at a particular frequency within the operating range of frequencies to increase the output impedance of the transistor package and the effective range of operating frequencies.

2. The transistor package recited in claim 1 wherein the second means is formed on the insulating member in displaced relationship to the transistor die.

3. The transistor package recited in claim 1 wherein the shunt capacitance is produced primarily by capacitive effects between the transistor die, the insulating member and the body member; and
    the series inductance is produced primarily by one of the metallic layers and wherein the transistor die is disposed between the metallic layers.

4. The transistor package recited in claim 1 wherein a particular one of the metallic layers defines a reference potential and the second means is formed on the particular metallic layer and is connected to the particular metallic layer.

5. The transistor package recited in claim 1 wherein the second means comprises an MOS capacitive reactance disposed on the insulating member and the third means comprises at least one wire connected between the second means and the transistor die.

6. The transistor package recited in claim 5 wherein a particular one of the metallic layers defines a reference potential and wherein one of the second means and the third means is electrically connected to the particular metallic layer and wherein the transistor die has particular boundaries and wherein the at least one wire comprising the third means is connected to the transistor die in symmetrical relationship with the boundaries of the transistor die.

7. A transistor having properties including an output impedance having a real component and an imaginary component and having an operating range of frequencies, including:
    a body member;
    a plurality of metallized elements disposed on the body member in spaced relationship to one another and defining terminals including an input terminal, an output terminal, and a reference terminal;
    a transistor die disposed on the body member between the metallized terminals and defining a transistor and having at least one input electrode connected to the input terminal and at least one reference electrode connected to the reference terminal,
    the transistor die and the metallized elements being constructed and disposed relative to one another on the body member to define an equivalent output circuit,
    the transistor die being constructed to provide an equivalent capacitance in the equivalent output circuit;
    at least one of the metallized elements being constructed to provide inductive characteristics in the equivalent output circuit;
    first means disposed on the body member in contiguous but spaced relationship to the metallized elements to define a capacitance; and
    second means disposed on the body member in contiguous but spaced relationship to the metallized elements to define an inductance in series with the capacitance and connected electrically to the first means and the transistor die to define a parallel relationship between the series circuit and the equivalent capacitance,
    the second means being provided with a greater inductive reactance than the first means at a particular frequency within the operating range,
    the first means and the second means being constructed to provide a resonance with the equivalent capacitance in the equivalent output circuit at the particular frequency to increase the real component of the output impedance and to broaden the operating range of frequencies.

8. The transistor set forth in claim 7 wherein the second means is defined by a metallized surface disposed on the body member in spaced relationship to the transistor die.

9. The transistor recited in claim 7 wherein the first means is defined by at least one thin conductive film disposed on the body member and the second means is provided by an electrical lead connected at one end to the first means and connected at the other end to the transistor die.

10. The transistor recited in claim 7 wherein the transistor die is defined by at least a pair of spaced boundaries and the second means includes at least a pair of wires each connected at one end to the first means and at the other end to the transistor die in symmetrical relationship with the pair of boundaries in the transistor die and with the other end of the wire in the pair.

11. The transistor set forth in claim 7 wherein the first means is defined by a plurality of thin films disposed on the body member in a symmetrical relationship to opposite ends of the transistor die.

12. The transistor set forth in claim 11 wherein the second means constitutes at least one electrical lead connected at one end to the first means and connected at the second end to the transistor die.

13. The transistor set forth in claim 12 wherein the transistor die is defined in part by first and second spaced boundaries and wherein the second means is connected at one end to the first means and at the opposite end to the transistor die and wherein the connection between the second means and the transistor die is at a position symmetrical with the first and second boundaries.

14. The transistor set forth in claim 13 wherein the first means is defined by at least one thin film conductive film disposed on the body member and electrical connections are provided between the first means and the second means.

15. A method of making a transistor having characteristics for operating within a particular operating range of frequencies including the steps of:
providing a body member having insulative characteristics;
providing a ground terminal on the body member;
plating on the body member a thin layer of electrically conductive metallic material;
forming at least one transistor cell on a substrate to provide a transistor die;
positioning the transistor die on the layer of electrically conductive material, the transistor die and the layer of electrically conductive material providing in an equivalent output circuit of the transistor characteristics including an equivalent inductance and an equivalent capacitance in series;
providing a second thin layer of electrically conductive material in electrically insulated relationship to the transistor die and the first thin layer to define a capacitance;
providing a reactance branch including at least an inductor and the capacitor in series and having inductively reactive properties at a particular frequency within the operating range; and
connecting the reactance branch to the transistor die and the ground terminal to oppose the influence of the equivalent capacitance in the equivalent output circuit of the transistor.

16. The method recited in claim 15 wherein the step for providing the reactance branch includes the step of:
connecting a metallized strip member to the second thin layer of the electrically conductive material and to the transistor die to provide the inductance of the reactance branch.

17. The method recited in claim 16 further comprising the steps of:
connecting an electrical lead between the transistor die and the second thin film of electrically conductive material to define the inductance in the reactance branch.

18. A transistor package having an input conductor, an output conductor and a reference conductor and characterized in part by an equivalent output circuit and having an operating range of frequencies, the package including:
means providing a structural support for the transistor package;
insulating means disposed on the structural support means to provide an electrical insulation;
electrically conductive pedestal means disposed on the insulating means and having a supporting surface in electrically conductive relationship with the output conductor of the transistor package and in electrically insulated relationship with the structural support means to define an inductance and to further define a capacitance with the insulating means and the structural support means, with the capacitance and the inductance being in series and with the reactance of the inductance being greater than the reactance of the capacitance at a particular frequency within the operating range;
a transistor die disposed on the supporting surface of the pedestal means to define a transistor having an input terminal, a reference terminal and an output terminal, the input terminal and the reference terminal respectively being electrically connected to the input conductor and the reference conductor of the transistor package, the transistor die being constructed to define a capacitive reactance in the equivalent output circuit in parallel with the series circuit defined by the inductance and the capacitance; and
the pedestal means and the insulating means being constructed to define a resonant circuit with the capacitive reactance at the particular frequency within the operating range to increase the impedance of the equivalent output circuit and widen the output range of frequencies.

19. The transistor package recited in claim 18 wherein supporting means are disposed on the structural support means and wherein electrically conductive means are disposed on the supporting means in insulating relationship to the structural support means to define the input conductor and the reference conductor.

20. The transistor package recited in claim 19 wherein electrical leads are connected between the input terminal of the transistor die and the electrically conductive means defining the input conductor and between the reference terminal of the transistor die and the electrically conductive means defining the reference conductor.

* * * * *